United States Patent [19]

Matsuyama

[11] Patent Number: 5,185,759
[45] Date of Patent: Feb. 9, 1993

[54] PHASE-SHIFTED DISTRIBUTED FEEDBACK TYPE SEMICONDUCTOR LASER DEVICE

[75] Inventor: Takayki Matsuyama, Yokohama, Japan

[73] Assignee: Kabushiki Kaisha Toshiba, Kawasaki, Japan

[21] Appl. No.: 713,309

[22] Filed: Jun. 11, 1991

[30] Foreign Application Priority Data

Jun. 12, 1990 [JP] Japan .................................. 2-151539

[51] Int. Cl.⁵ .............................................. H01S 3/08
[52] U.S. Cl. ......................................... 372/96; 372/46
[58] Field of Search ............................. 372/96, 46, 45

[56] References Cited

U.S. PATENT DOCUMENTS

| 4,726,031 | 2/1988 | Wakao et al. | 372/96 |
| 4,802,187 | 1/1989 | Bouley et al. | 372/96 |
| 4,847,857 | 7/1989 | Ohkura | 372/96 |

FOREIGN PATENT DOCUMENTS

| 0046087 | 3/1985 | Japan | 372/96 |
| 0202487 | 9/1986 | Japan | 372/96 |
| 0137496 | 6/1988 | Japan | 372/96 |
| 63-137496 | 6/1988 | Japan | |
| 0260185 | 10/1988 | Japan | 372/96 |
| 2195822 | 4/1988 | United Kingdom | |

OTHER PUBLICATIONS

Electronics Letters, vol. 20, No. 24, pp. 1016-1018, Nov. 22, 1984, H. Soda, et al., "GaInAsP/InP Phase-Adjusted Distributed Feedback Lasers With A Step-Like Non-Uniform Stripe Width Structure".
IEEE Journal of Quantum Electronics, vol. 24, No. 10, pp. 2017-2033, Oct. 1988, Y. Nakano, et al., "Analysis, Design, and Fabrication of GaAlAs/GaAs DFB Lasers With Modulated Stripe Width Structure For Complete Single Longitudinal Mode . . . ".
Eletronics Letters, vol. 20, No. 2, pp. 82-84, Jan. 19, 1984, K. Tada, et al., "Proposal Of A Distributed Feedback Laser With Nonuniform Stripe Width For Complete Single-Mode Oscillation".
Electronics Letters, vol. 24, 731-732; S. Ogita et al.; Jun. 1988 "Optimum Design for Multiple-Phase-Shift Distributed Feedback Laser".
Electronics Letters, 19th Jan. 1984, vol. 20, No. 2; pp. 80-81; "1.5 μm Phase-Shifted DFB Lasers for Single-Mode Operation".
Electronics Letters, 19th Jan. 1984, vol. 20, No. 2; pp. 82-84; "Proposal of a Distributed Feedback Laser With Nonuniform Stripe Width for Complete Single-Mode Oscillation".

Primary Examiner—Georgia Y. Epps
Attorney, Agent, or Firm—Oblon, Spivak, McClelland, Maier & Neustadt

[57] ABSTRACT

A semiconductor laser device has a periodic structure for distributively feeding back light. A waveguide for guiding light along the periodic structure is provided. A plurality of waveguide regions having a light confinement coefficient set to vary along the periodic structure and an equivalent amount of phase shift with respect to the phase of the periodic structure set to an integer multiple of $\pi$ are provided. The total phase shifting amount of light by the waveguide is set to a value different from an integer multiple of $\pi$.

4 Claims, 6 Drawing Sheets

FIG. 12

PHASE-SHIFTED DISTRIBUTED FEEDBACK TYPE SEMICONDUCTOR LASER DEVICE

BACKGROUND OF THE INVENTION

1. Field of the Invention

This invention relates to a laser device, and more specifically to a distributed feedback type laser device having a periodic structure for distributively feeding back a laser light.

2. Description of the Related Art

A distributed feedback type semiconductor laser device oscillating in a longitudinal single mode is a key device which is indispensable for a large-capacity and high-speed optical communication system. The distributed feedback type semiconductor laser device oscillates in two longitudinal modes in principle. For example, structures (a) and (b) described below are known in the art in order to attain the longitudinal single mode, (a) In part of the periodic structure (diffraction grating), a portion in which the period of the diffraction grating is deviated by $\pi$ in phase is formed.

(b) A waveguide having two or more portions having different propagation constants is arranged and a structure in which a phase of light is shifted by an integer multiple of approx. $\pi/2$ is formed.

The semiconductor laser device with the above construction is called a phase-shifted distributed feedback laser device. For example, such a phase-shifted distributed feedback laser device is disclosed in ELECTRONICS LETTERS, 19th Jan. 1984, Vol. 20. No. 2, pp 80 and 81, "1.5 $\mu$m PHASE-SHIFTED DFB LASERS FOR SINGLE-MODE OPERATION", ELECTRONICS LETTERS, 19th Jan. 1984, Vol. 20, No. 2, pp 82 to 84, "PROPOSAL OF A DISTRIBUTED FEEDBACK LASER WITH NONUNIFORM STRIPE WIDTH FOR COMPLETE SINGLE-MODE OSCILLATION" and the like.

Figure 1:
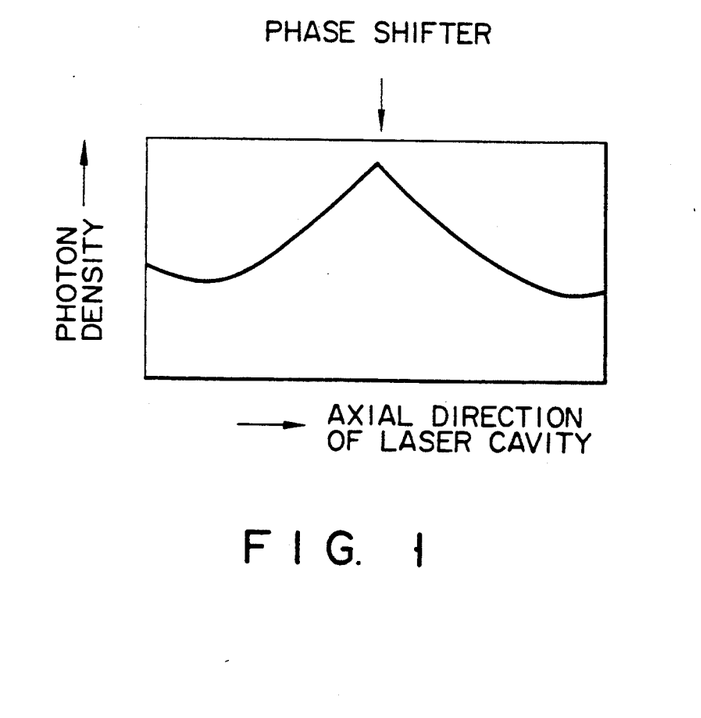
FIG. 1 is a distribution diagram showing the photon density in the axial direction of a cavity of the conventional semiconductor laser device.

However, in a distributed feedback type semiconductor laser device, the photon density in the cavity sometimes markedly varies in the axial direction as shown in FIG. 1. FIG. 1 is a distribution diagram showing a relation between the axial direction of laser cavity and the photon density. As is clearly seen from FIG. 1, the photon density rapidly increases in a portion in which a phase shifter is formed. Further, the distribution of the photon density varies in the axial direction by the hole burning effect in the axial direction after the laser oscillation. As a result, there may occur a problem that the linearity of the current-light output characteristic (which is hereinafter referred to as the I-L characteristic) is deteriorated and the gain difference between the main oscillation mode and sub-oscillation mode is lowered.

Figure 2:
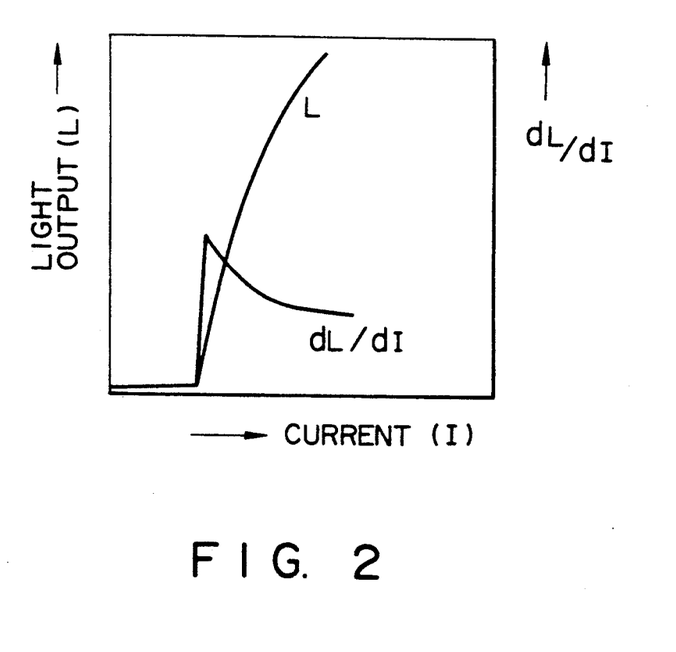
FIG. 2 is a characteristic diagram showing the current-light output characteristic and the dL/dI characteristic of the conventional semiconductor laser device.

In FIG. 2, the I-L characteristic and dL/dI characteristic of the conventional laser element are shown. As shown in FIG. 2, the linearity of the I-L characteristic is insufficient since the hole burning effect occurs after the laser oscillation. Further, since variation occurs in the phase of the end facet and the shape of the inherent waveguide of each laser element, the frequency of the hole burning phenomena will be changed. The above-described causes lower the manufacturing yield of distributed feedback type semiconductor laser devices. In order to suppress the occurrence of the hole burning, the standardized coupling coefficient kL may be set to an optimum value, but in practice, it is extremely difficult to control kL.

SUMMARY OF THE INVENTION

Accordingly, an object of this invention is to provide a semiconductor laser device which can control the hole burning and in which the laser characteristic and the manufacturing yield can be improved.

The above object can be attained by a semiconductor laser device comprising a periodic structure for distributing and feeding back light, the periodic structure forming a laser cavity, and a waveguide for guiding the light along the periodic structure, the waveguide having a light confinement coefficient changing along an axis of the laser cavity, wherein the sum of the total phase shift of light, which occurs in the waveguide, and an equivalent phase shift of light, which occurs due to the phase of the periodic structure, is other than an intergral multiple of $\pi$.

In the semiconductor laser described above, the sum of the total phase shift of light, occurring in the waveguide, and the phase shift of light, occurring due to the phase of the periodic structure, is other than an integral multiple of $\pi$. Further, the waveguide has a light confinement coefficient which changes along the axis of the laser cavity. Therefore, it is possible to control the photon-density distribution in the axial direction of the laser cavity, while vertical single-mode oscillation is being performed. Thus, hole burning can be suppressed. As a result, the gain difference between the modes can be prevented from being greatly changed after the laser oscillation and a laser device which stably oscillates in a longitudinal single mode can be obtained with a high manufacturing yield.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 3:
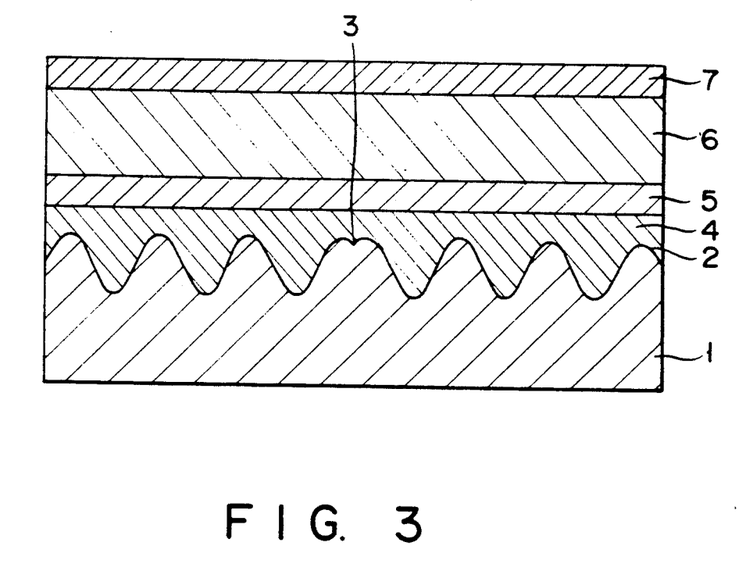
FIG. 3 is a cross sectional view showing a semiconductor laser device according to a first embodiment of this invention and taken along a line perpendicular to the oscillator plane of the laser element.
Figure 4:
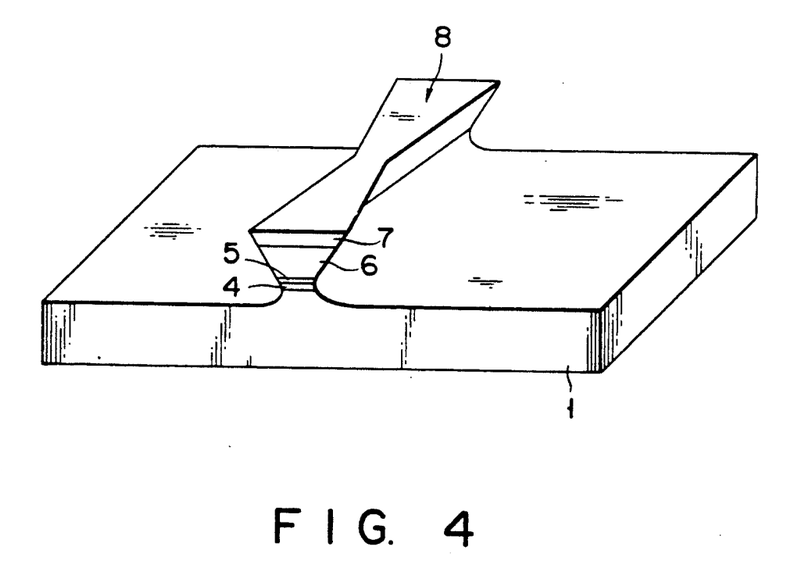
FIG. 4 is a perspective view for illustrating the shape of a waveguide of the laser element shown in FIG. 3.
Figure 5:
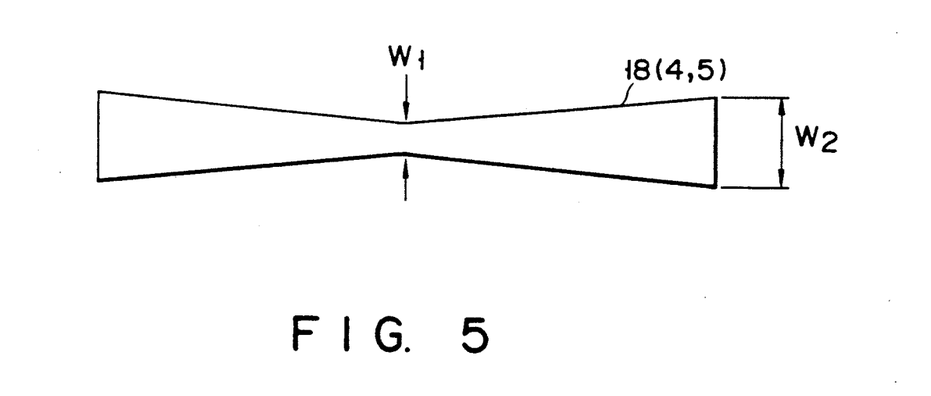
FIG. 5 is a plan view of the waveguide of the laser element shown in FIG. 4.
Figure 6:
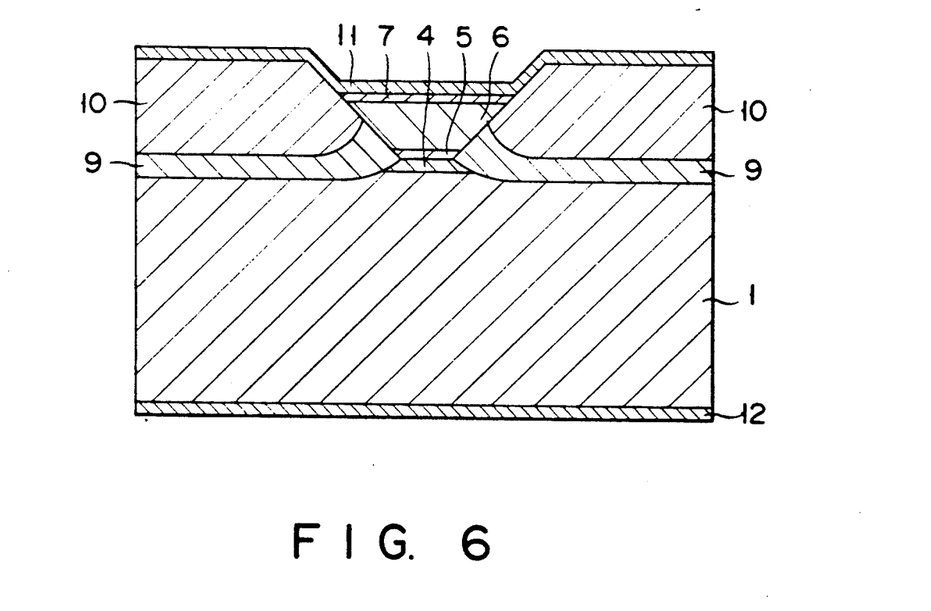
FIG. 6 is a cross sectional view for illustrating the semiconductor laser device according to the first embodiment of this invention and taken along a line parallel to the cavity plane.

FIGS. 3 to 6 show a semiconductor laser device of the first embodiment of this invention, FIG. 3 is a cross sectional view showing the semiconductor laser device taken along a line perpendicular to the cavity plane of the laser element, FIG. 4 is a perspective view for illustrating the shape of the waveguide, FIG. 5 is a plan view of the waveguide of the laser element shown in FIG. 4 when viewed from the above, and FIG. 6 is a cross sectional view taken along a line parallel to the cavity plane. The first embodiment of the invention is a semiconductor laser, wherein the total phase shift of light, which occurs in the waveguide, is an integral multiple of $\pi$, and the sum of the total phase shift of light and the equivalent phase shift of light, which occurs due to the phase of the periodic structure, is also an integral multiple of $\pi$.

The laser element shown in FIGS. 3 to 6 is manufactured as follows.

First, as shown in FIG. 3, a diffraction grating 2 is formed on an n-InP (n-type indium-phosphorus) substrate 1. In this case, a portion in which the period of the diffraction grating 2 is shifted by a phase $\pi$, that is, a phase shifter 3 is formed. To shift the phase of the periodic structure, i.e. the refractive lattice, by $\pi$, is to shift the equivalent phase of light by $\pi/2$. An n-InGaAsP (n-type indium-gallium-arsenic-phosphorus) guide layer 4, an InGaAsP active layer 5, a p-InP clad layer 6 and a p+-InGaAsP layer 7 are sequentially formed on the diffraction grating 2 by the crystal growth. Next, the InGAsP layer 7, clad layer 6, active layer 5, guide layer 4 and a surface portions of substrate 1 are selectively removed by use of the photolithography technology and wet etching method so as to form an inverted mesa-shaped stripe 8 as shown in FIG. 4. As shown in FIG. 5, the plane structure of the waveguide 18 (guide layer 4 and active layer 5) is made such that the width of the central portion of the cavity is set to $W_1$ ($\mu$m) and the width of the end portion of the cavity is set to $W_2$ ($\mu$m). The widths $W_1$ and $W_2$ are designed such that the total of the equivalent phase shift of light amounts in the waveguide region may become equal to an integer multiple of $\pi$. If the guide layer 4 and the active layer 5 have thicknesses of 0.07 $\mu$m and 0.10 $\mu$m, respectively, and the laser cavity has a length of 300 $\mu$m, $W_1$ and $W_2$ will be set at 0.5 $\mu$m and 1.0 $\mu$m, respectively. In this embodiment, the total phase shift, which depends on the width of the waveguide 18, can be calculated based on the assumption that the waveguide is formed of a number of parts which have slightly different widths.

Next, crystal is grown on the semiconductor structure shown in FIG. 4 to sequentially form a p-InP layer 9 and an n-InP layer 10 on the substrate 1 as shown in FIG. 6. Then, electrode metal layers 11 and 12 are deposited on both side surfaces of the wafer having laser elements thus formed and the semiconductor structure is cleaved to have a width of approx. 400 $\mu$m and a length of approx. 300 $\mu$m. Further, a non-reflection film such as an SiNx film is formed on the facet by the plasma CVD method, thus completing a distributed feedback type semiconductor laser device.

In the above-described distributed feedback type semiconductor laser device, since the light confinement in the central portion of the cavity is weakened, the distributions of the photon density in the axial direction of the cavity may be made further flat in comparison with the conventional laser device.

Figure 7:
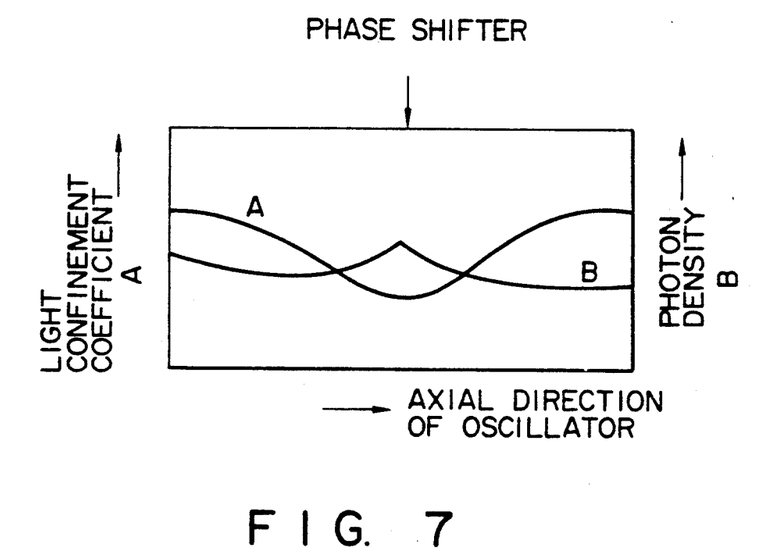
FIG. 7 is a distribution diagram showing the relation between the photon density and the light confinement coefficient in the axial direction of the oscillator of the semiconductor laser device according to the first embodiment of this invention.

In FIG. 7, the distributions of the light confinement coefficient and the photon density in the axial direction of the oscillator in the semiconductor laser device according to the first embodiment are shown. As is clearly seen from FIG. 7, with the structure of this embodiment, since the light confinement in the central portion of the cavity is weakened, the photon density is prevented from concentrating in the central portion of the cavity.

Figure 8:
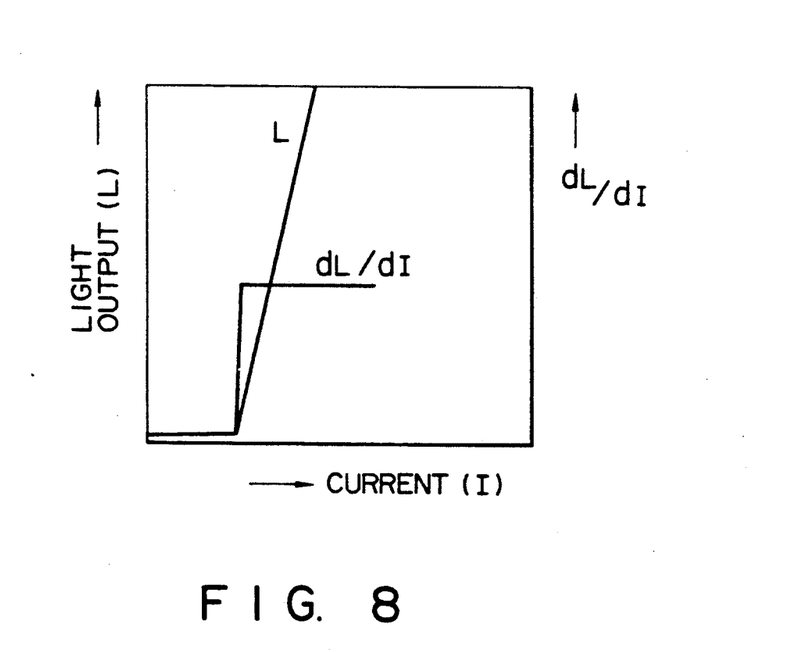
FIG. 8 is a characteristic diagram showing the current-light output characteristic and the dL/dI characteristic of the semiconductor laser device according to the first embodiment of this invention.

In FIG. 8, the current-light output (I-L) characteristic and dL/dI characteristic according to this invention are shown. In the laser device of this embodiment, the hole burning effect does not occur after the laser oscillation and a sufficiently linear I-L characteristic can be attained as shown in FIG. 8. Further, there can be obtained a laser device in which a difference in the gain between the main oscillation mode and sub-oscillation mode will not greatly vary after the laser oscillation and the stable oscillation of the longitudinal single mode can be attained since the hole burning does not occur and which can be manufactured with a high manufacturing yield.

Figure 9:
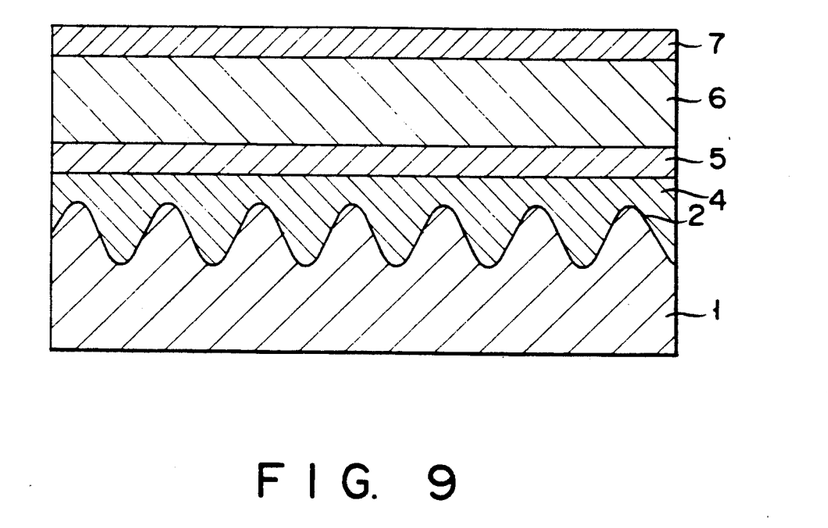
FIG. 9 is a cross sectional view showing a semiconductor laser device according to a second embodiment of this invention and taken along a line perpendicular to the cavity plane of the laser element.
Figure 10:
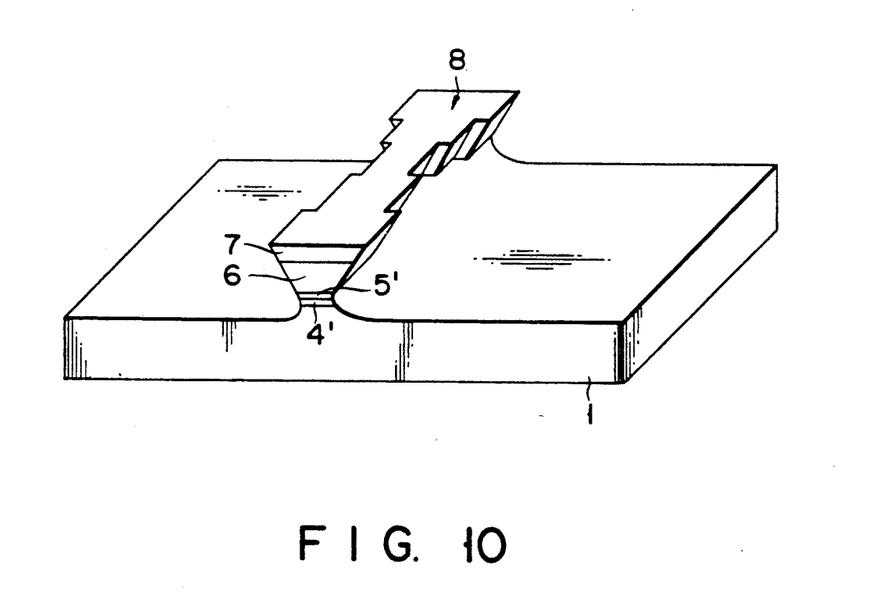
FIG. 10 is a perspective view for illustrating the shape of a waveguide of the laser element shown in FIG. 9.
Figure 11:
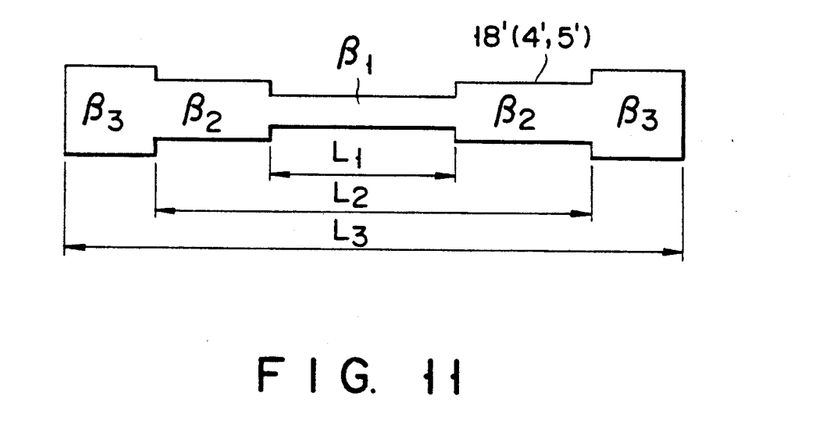
FIG. 11 is a plan view of the waveguide of the laser element shown in FIG. 10.
Figure 12:
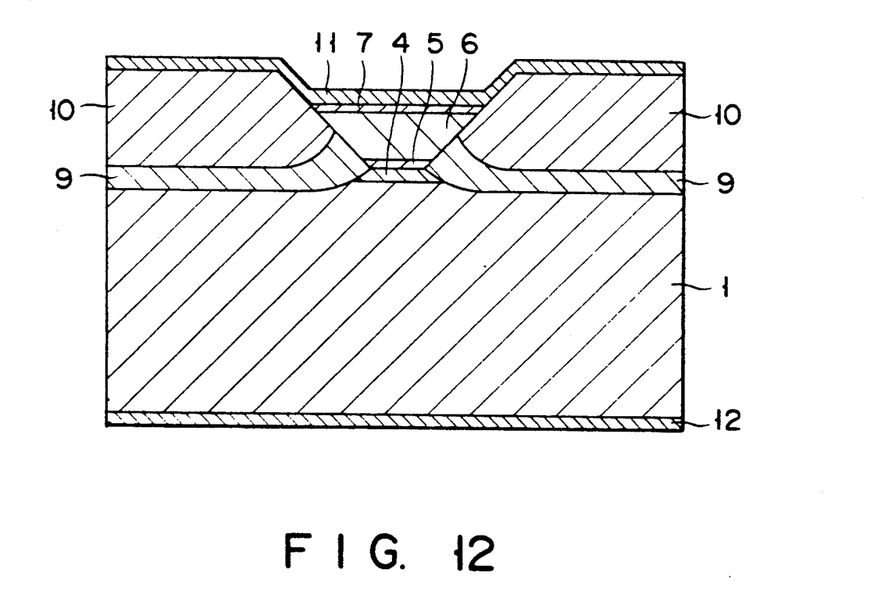
FIG. 12 is a cross sectional view for illustrating the semiconductor laser device according to the second embodiment of this invention and taken along a line parallel to the oscillator plane.

FIGS. 9 to 12 are diagrams for illustrating a semiconductor laser device of the second embodiment of this invention. FIG. 9 is a cross sectional view showing a laser element taken along a line perpendicular to the oscillator plane, FIG. 10 is a perspective view for illustrating the shape of inverted mesa-shaped strip including a waveguide, FIG. 11 is a top plan view of the waveguide of the laser element shown in FIG. 10 and FIG. 12 is a cross sectional view taken along a line parallel to the cavity plane. The second embodiment of the invention is a semiconductor laser, wherein the total phase shift of light, which occurs in the waveguide, is not an integral multiple of $\pi$, and the sum of the total phase shift of light and the equivalent phase shift of light, which occurs due to the phase of the periodic structure, is an integral multiple of $\pi$.

As shown in FIG. 9, the diffraction grating 2 is formed on the n-InP substrate 1, and an n-InGaAsP guide layer 4, an InGaAsP active layer 5, a p-InP clad layer 6 and a p+-InGaAsP layer 7 are sequentially formed on the diffraction grating 2 by the crystal growth. Next, the InGaAsP layer 7, clad layer 6, active layer 5, guide layer 4 and a surface portions of substrate 1 are selectively removed by use of the photolithography technology and wet etching method so as to form a inverted mesa-shaped stripe 8 as shown in FIG. 10. As shown in FIG. 11, the waveguide 18' is formed of three portions having different propagation constants, and when the propagation constants are $\beta_1$, $\beta_2$, and $\beta_3$ and the lengths of the waveguide portions are $L_1$, $L_2$ and $L_3$, the values are so set as to satisfy the condition expressed by by the following equations.

$$|\beta_1 - \beta_2| \cdot L_1 = n \cdot \pi/2$$

where n is a positive odd number and $\beta_1 \neq \beta_2$.

$$|\beta_2 - \beta_3| \cdot (L_2 - L_1) = n \cdot \pi$$

where $\beta_2 \neq \beta_3$.

In this embodiment, the total phase shift $\omega$, which depends on the width of the waveguide, is given as follows:

$$\omega = |\beta_1 - \beta_2| \cdot L_1 + |\beta_2 - \beta_3| \cdot (L_2 - L_1)$$

The total phase shift $\omega$ will not be an integral multiple of $\pi$ if the wave-guiding parts have such widths as would satisfy the following equations:

$$|\beta_1 - \beta_2| \cdot L_1 = n \cdot \pi/2 (n = 1,3,5,\ldots)$$

$$|\beta_2 - \beta_3| \cdot (L_2 - L_1) = n \cdot \pi$$

where $\beta_1 \neq \beta_2$ and $\beta_2 \neq \beta_3$

On the other hand, the equivalent phase shift of light, which occurs due to the phase of the periodic structure, can be regarded as an integral multiple of $\pi$ since the periodic structure has no phase shifters. Hence, the sum of the total phase shift $\omega$ and the equivalent phase shift of light occurring due to the phase of the structure is not an integral multiple of $\pi$. Thus, it is possible to control the photon-density distribution in the axial direction of the laser cavity, while vertical single-mode oscillation is being performed.

Let us assume that the guide layer and the active layer have thicknesses of 0.07 μm and 0.10 μm, respectively. Then, the total phase shift $\omega$, which depends on the width of the waveguide, will not be an integral multiple of $\pi$ if $W_1$, $W_2$ and $W_3$ are 1.5 μm, 1.0 μm, and 0.5 μm, respectively, and if $L_1$, $L_2$ and $L_3$ are 20 μm, 30 μm and 40 μm, respectively. Here, $W_1$, $W_2$ and $W_3$ are the widths of those three parts of the waveguide which are responsible for propagation constants $\beta_1$, $\beta_2$, and $\beta_3$, respectively. (The constants $\beta_1$, $\beta_2$, and $\beta_3$ are determined by the thicknesses of the active layer and the guide layer, the widths and lengths of the wave-guiding parts.)

Next, crystal is grown on the semiconductor structure shown in FIG. 10 to sequentially form a p-InP layer 9 and an n-InP layer 10 on the substrate 1. After electrode metal films 11 and 12 are deposited on the wafer having the laser element formed in the above process, the structure is cleaved to have a width of approx. 400 μm and a length of approx. 300 μm. Further, a non-reflection film such as an SiNx film is formed on the facet by the plasma CVD method, thus completing a distributed feedback type semiconductor laser device.

In the distributed feedback type semiconductor laser device of the second embodiment, the distributions of the photon density in the axial direction of the oscillator may be made further flat in comparison with the conventional laser device like the first embodiment. Therefore, the same effect and operation as those of the first embodiment can be obtained.

In the above embodiments, the coefficient of the light confinement is modulated and the distributions of the photon density are improved, but this invention is not limited to this and the thickness of the waveguide may be modulated along the axial direction of the oscillator.

As described above, according to this invention, a semiconductor laser device in which the hole burning can be suppressed and the laser characteristic and manufacturing yield can be improved ca be provided.

What is claimed is:

1. A distributed feedback type semiconductor laser device having a periodic structure for distributively feeding back light, an active layer sandwiched between clad layers, a waveguide for guiding the light along said periodic structure, and first and second electrodes for injecting current into said active layer, said laser device comprising:

a structure for shifting the phase of the transmitted light by changing at least one of the width and thickness of the waveguide along the periodic structure; and a plurality of waveguide regions in which the shifting amount of the phase of the transmitted light caused by the change of at least one of the width and thickness of the waveguide is substantially an integral multiple of $\pi$;

wherein the sum of the total phase shift of the transmitted light caused by the change of at least on of the width and thickness of the waveguide is substantially an odd number multiple of $\pi/2$.

2. A distributed feedback type semiconductor laser device according to claim 1, wherein the phase shift amount of the transmitted light caused by changing at least one of the width and thickness of said waveguide is substantially an integral multiple of $\pi$, and the phase shift amount of the transmitted light caused by shifting the phase at a diffraction grating is substantially an odd number multiple of $\pi/2$.

3. A distributed feedback type semiconductor laser device according to claim 1, wherein said waveguide has a width smaller in the central portion of a resonator than in the end portion of the resonator.

4. A semiconductor laser device according to claim 1, wherein said waveguide has a plurality of wave-guiding regions having different propagation constants.

* * * * *

UNITED STATES PATENT AND TRADEMARK OFFICE
CERTIFICATE OF CORRECTION

PATENT NO. :  5,185,759

DATED :  February 9, 1993

INVENTOR(S) :  Takayuki Matsuyama

It is certified that error appears in the above-identified patent and that said Letters Patent is hereby corrected as shown below:

On the title page, Item [75],

The inventor's name is spelled incorrectly, should be, --Takayuki Matsuyama--

Signed and Sealed this

Second Day of November, 1993

*Attest:*

BRUCE LEHMAN

*Attesting Officer*     *Commissioner of Patents and Trademarks*